United States Patent [19]

Henry

[11] 4,122,442
[45] Oct. 24, 1978

[54] INTEGRABLE BIDIRECTIONAL SHIFT REGISTER IN ANALOG-TO-DIGITAL CONVERTER

[75] Inventor: James Lowell Henry, Allentown, Pa.

[73] Assignee: Bell Telephone Laboratories, Incorporated, Murray Hill, N.J.

[21] Appl. No.: 817,174

[22] Filed: Jul. 20, 1977

[51] Int. Cl.² ............................................. H03K 13/22
[52] U.S. Cl. .............................. 340/347 AD; 325/38 B
[58] Field of Search .................. 340/347 M, 347 AD; 325/38 R, 38 B; 332/11 D

[56] References Cited

U.S. PATENT DOCUMENTS

| | | |
|---|---|---|
| 3,573,802 | 4/1971 | Kawashima ................... 340/347 AD |
| 3,634,856 | 1/1972 | Karlsson ....................... 340/347 AD |
| 3,925,731 | 12/1975 | Brainard .............................. 325/38 B |

*Primary Examiner*—Charles D. Miller
*Attorney, Agent, or Firm*—Herbert M. Shapiro

[57] ABSTRACT

A multistage bidirectional shift register for a differential pulse code system, simple enough to be integrated inexpensively, is achieved by taking advantage of the code configuration conditions permitted by the pulse code system. The system requires only a single stage of the register to be switched at a time. This enables odd and even stages of the register to be switched independently and leads to the employment of relatively few elements per stage.

6 Claims, 6 Drawing Figures

INTEGRABLE BIDIRECTIONAL SHIFT REGISTER IN ANALOG-TO-DIGITAL CONVERTER

FIELD OF THE INVENTION

This invention relates to semiconductor integrated bidirectional shift registers useful for differential pulse coded systems using shift register companding.

BACKGROUND OF THE INVENTION

U.S. Pat. No. 3,925,731 of R. C. Brainard and J. C. Candy, issued Dec. 9, 1975, discloses a differential pulse coded system using shift register companding. The system employs a bidirectional shift register in which a 1-bit differential pulse code is converted to analog form by a companded digital integration, i.e., a digital accumulation, followed by a digital-to-analog conversion for producing a discrete approximation of the analog signal represented by the differential pulse code. The term "companded integration" is defined in that patent as meaning one employing non-uniform step sizes and distinguishing from uniform integration employing uniform step sizes, even though in both cases a compressed code may be employed.

The bidirectional shift register employed in such a system is operative to move a 1-bit differential pulse code represented by a sequence of binary ones followed by a sequence of binary zeros in a succession of shift register stages. The sequence is characterized by a 0-1 interface at a pair of neighboring stages. The code in total, but most importantly the interface, is moved in response to an analog input signal back and forth in the shift register to positions in the register determinative of a corresponding digital output in each instance according to the teachings of the above-mentioned patent.

Although the arrangement is particularly attractive in organization, the implementation thereof in the form of an integrated semiconductor chip is complicated because of the necessity of a relatively large number of semiconductor elements heretofore. This problem is brought into focus when the use of such an arrangement for digitizing the telephone system is considered. The economics of such arrangements are such that 24 telephone lines are presently multiplexed for use with a single coder for digitizing signals. The ideal, of course, would be a coder for each telephone line. This ideal can be reached only when low cost integration of the coder reduces the present price significantly.

The use of a bidirectional shift register as disclosed in the above-mentioned patent permits some reduction in cost over prior art coders. But still the cost is too high to permit a coder per telephone line. The high cost of this type of system is clear when one considers the number of elements necessary for its implementation. Consider, for example, an 8-bit bidirectional shift register of the type SN54194 shown in Texas Instruments Inc.'s *TTL Data Book for Design Engineers*, 1973 edition, on page 438, where each of the blocks (CK) includes one-half of a number 7474 register shown in the Data Book at page 122.

BRIEF DESCRIPTION OF THE INVENTION

The present invention is directed at a semiconductor bidirectional shift register of the type described hereinbefore which has relatively few elements so that integration thereof is relatively simple and inexpensive and is useful particularly as a digital accumulator in interpolative encoders for per-channel voiceband applications. The stages of the shift register utilize four gates per stage, rather than (more than) nine gates per stage utilized in early implementations of an arrangement in accordance with the above-mentioned patent. The register is operative to store a binary number that corresponds to the magnitude of the quantized analog signal and it drives a binary-weighted digital-to-analog conversion network that generates the quantized signal as described in the above-mentioned patent.

The simple organization of the register is permitted because the register is used only to enter binary ones from one end of the register while only binary zeros are entered from the other end. The contents of the register therefore takes the form of a string of ones followed by a string of zeros. On any shift clock pulse only the contents of a single stage are changed, a fact which permits independent clocking of alternate (odd or even) stages of the register. As a consequence, each stage of the register can be implemented with a simple gate latch. Only one of four required clock lines is activated at each clock time depending on whether a shift in a first or second direction in the register is required.

DETAILED DESCRIPTION

Figure 1:
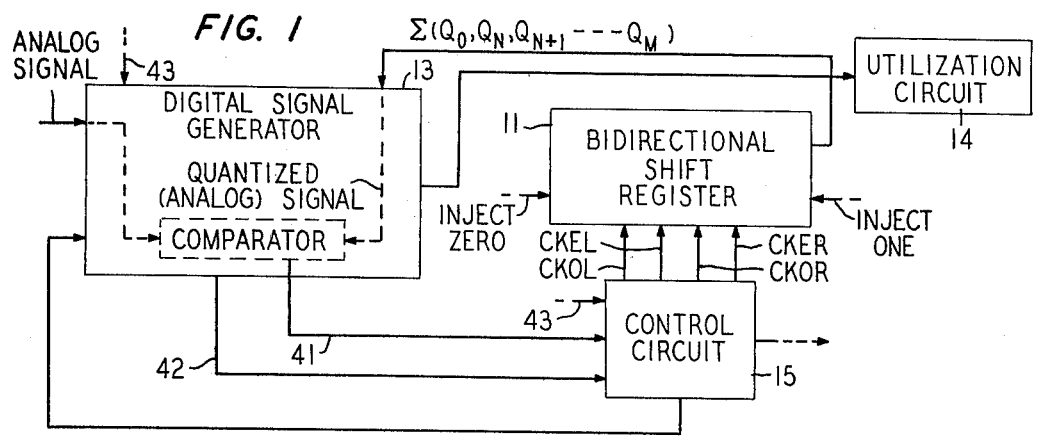
FIG. 1 is a block diagram illustrating a bidirectional shift register in an interpolative encoder.

FIG. 1 shows a block diagram of a communication system 10 utilizing a bidirectional shift register 11 for coding by companding techniques. The overall illustrative system is intended to correspond to that described in the above-mentioned patent and therefore is not described in detail herein. Suffice to say that the system is operative to code digital input signals from a source represented by block 13 into a summed digital signal to be compared with the input signal. A comparison signal is generated for transmission to a utilization circuit represented by block 14. The operation is under the control of a control circuit represented by block 15 which, inter alia, supplies clock pulses to shift register 11. The organization of shift register 11 and the clock pulses applied thereto are considerably different from the prior art organization and operation described in the above-mentioned patent. Yet coding compatibility with that prior art system is achieved. Therefore, attention herein is directed to the organization of the shift register and its operation under the control of circuit 15.

Figure 2:
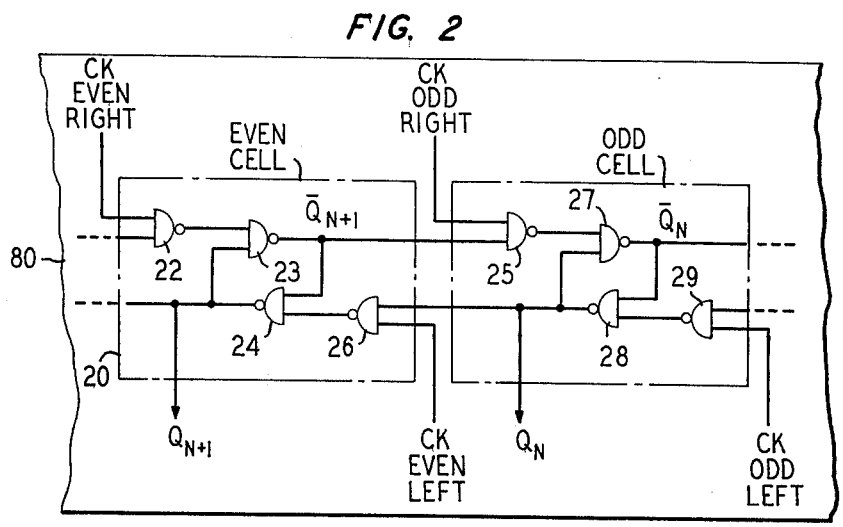
FIGS. 2 and 3 are schematic diagrams of the organization of various stages of the bidirectional shift register of FIG. 1.
Figure 3:
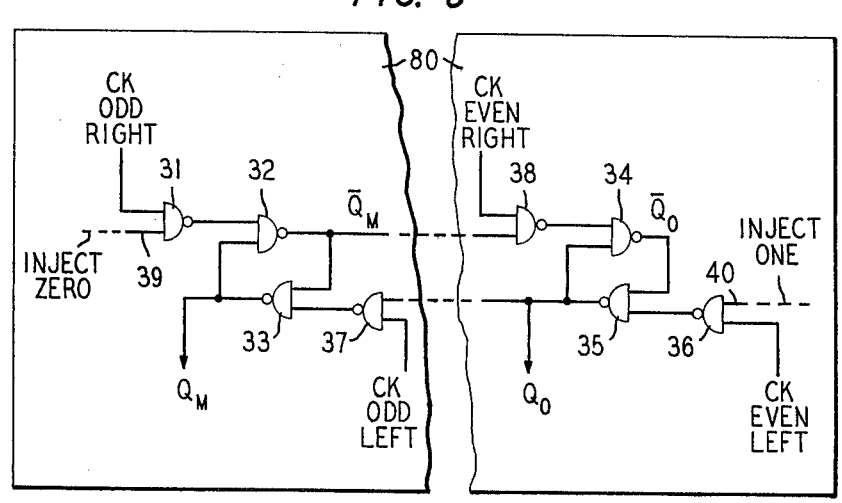

FIGS. 2 and 3 show the organizations of the various stages of register 11 for achieving the simplicity, in accordance with this invention, desired for permitting integration into a single semiconductor chip. FIG. 2 specifically shows a pair of adjacent stages of shift register 11. The stages include sections encompassed by broken blocks 20 and 21 and are designated, respectively, "even" and "odd" cells as can be seen in FIG. 2. The two stages comprise eight gates 22, 23, . . . 29, gates 23 and 24 and gates 27 and 28 being included in the even and odd cells, respectively. For illustrative purposes, the gates are NAND gates each having the familiar property of providing a (high voltage) output except when the two inputs thereto are at high voltage.

The two stage arrangement of FIG. 2 is organized so that an output of an earlier stage is connected to an input of gate 22 and the clock "even right" pulse (CKER) output of control circuit 15 is connected to a second input of gate 22. The output of gate 22 is connected to an input of gate 23. The output of gate 24 is connected to a second input of gate 23. The output of gate 23, in turn, is connected to the inputs of each of gates 24 and 25. The clock "odd right" pulse (CKOR) output of circuit 15 is connected to the second input of gate 25.

Similarly, the output of a next subsequent stage is connected to an input to gate 29. The clock "odd left" pulse (CKOL) output of control circuit 15 is connected to a second input to gate 29. The output of gate 29 is connected, in turn, to an input to gate 28. The output of gate 28 is connected to inputs of each of gates 26 and 27. The clock "even left" pulse (CKEL) output of circuit 15 also is connected to an input to gate 26 and the output of gate 25 is connected to an input of gate 27. The output of gate 27 is connected to the input of gate 28. The arrangement of FIG. 2 is repetitive in register 11 of FIG. 1 constituting all but the end stages. For an illustrative 8-bit register, the arrangement thus repeats itself three times.

FIG. 3 shows the configuration for the end stages of the register. Specifically, FIG. 3 shows eight gates, four for each of the left-most and the right-most stages of register 11. The eight gates are designated 31, 32, ... 38. The left-most stage includes gate 31 with an (imaginary) input lead 39 adapted for an "inject zero" operation as will become clear hereinafter. A second input to gate 31 is connected to the clock "odd right" output of control circuit 15. The output of gate 31 is connected to an input of gate 32. The output of gate 32 is connected to an input of gate 33 and of, say, gate 22 of FIG. 2. The output of gate 33 is connected to a second input of gate 32. One input of gate 37 is connected to the clock "odd left" output of circuit 15. A second input of gate 37 is connected to the output of, say, gate 24 of FIG. 2.

Similarly, the right-most stage includes gate 36, one (imaginary) input of which is designated 40 and is adapted for an "inject one" operation. The other input of gate 36 is connected to the clock "even left" output of control circuit 15. The output of gate 36 is connected to an input gate 35. The output of gate 35, in turn, is connected to an input of gate 34. The output of gate 27 (of FIG. 2) is connected to the input of gate 38, the second input of which is connected to the clock "even right" output of circuit 15. The output of gate 38 is connected to a second input of gate 34.

The register of FIGS. 2 and 3 is operative to apply outputs $Q_0, Q_1, Q_2 \ldots Q_N, Q_{N+1}, \ldots Q_M$, to digital signal generator 13 as taught in the above-mentioned patent. Source 13 responds to apply a "quantized" analog signal to a comparator included therein. An input analog signal also is applied to that comparator. The register (11) develops its outputs by the shifting of a string of zeros and a string of ones in first and second directions in the register depending on a direction-control signal which is the output of the comparator in a manner discussed further hereinafter.

Operation of the Shift Register

To inject a binary zero into the $M^{th}$ stage of FIG. 3, lead 39 is held in the one state during clock "odd right" active (in the one state). Similarly, to inject a binary one into $O^{th}$ stage, lead 40 is held in the one state during clock "even left" active. Indeed, in normal use, leads 39 and 40 as shown in FIG. 3 are always in the one state, and may be deleted so that gates 31 and 36 become simple inverters. Since this is the case, leads 39 and 40 are referred to as imaginary hereinbefore.

Assume that the shift register of FIGS. 2 and 3 is initially full of "zeros," i.e., all $Q$'s = 0, and all $\overline{Q}$'s = 1. When the clock "even left" is 'one,' the output of gate 36 FIG. 3 is low, forcing a 'one' in $Q_0$ of FIG. 3. If a clock "odd left" occurs next, the output of gate 29 goes low, forcing a 'one' in $Q_N$ of FIG. 2 ($Q_2$ in the example). Thus it can be seen that every clock time, a 'one' will be shifted to the left, and the shift register will fill up with 'ones.' If we now assume that the shift register is full of 'ones' and source 13 calls for continuous shift rights, say a clock "odd right" occurs first. Gate 31 goes low, forcing a one in $\overline{Q_M}$, and a zero in $Q_M$. The next clock pulse, a clock "even right" causes gate 22 to go low, forcing $\overline{Q_{N+1}}$ high, and allowing $Q_{N+1}$ to go to zero. Thus zeros are shifted to the right. In this way a block of zeros fills in from the left, and a block of ones fills in from the right, and the change between the two moves back and forth depending on whether a shift left or shift right is called for.

The Clock Circuit

Figure 4:
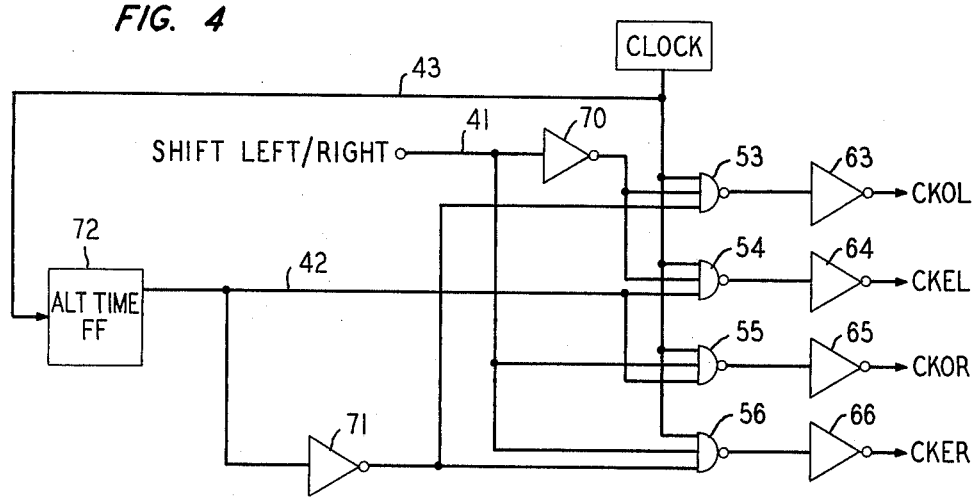
FIG. 4 is a circuit diagram of a logic circuit for the provision of clock pulses during the operation of the bidirectional shift register of FIG. 1.
Figure 5:
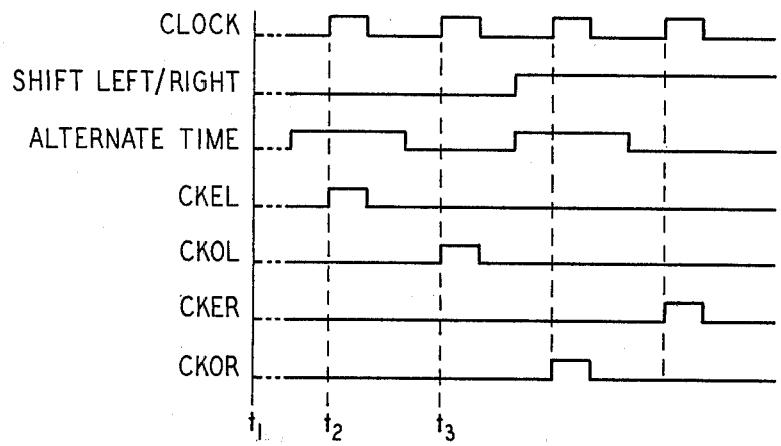
FIG. 5 is a pulse diagram of the operation of the circuit of FIG. 4.

FIG. 4 shows four NAND gates 53, 54, 55 and 56, the outputs of which are connected to the inputs of inverters 63, 64, 65, and 66 for providing clock pulses CKOL, CKEL, CKOR, and CKER, respectively. An input to each of the NAND gates is connected to line 43 to which (internal) clock pulses of FIG. 5 are applied. Line 41, the shift left or right direction control, is connecte directly to inputs to each of gates 55 and 56, and through inverter 70 to inputs of each of gates 53 and 54. Similarly, line 42 is connected directly to inputs to each of gates 54 and 55 and through inverter 71 to inputs to gates 53 and 56. Line 2 is connected to the output of "alternate-time" toggle 72 also driven by the clock pulses as described further hereinafter.

Operation of Clock Circuit FIGS. 4 and 5

The three input lines, 41, 42, and 43, control the clock circuit. Line 43 enables one of the clock outputs each time it is in a binary one state, as shown in FIG. 5. The particular output which is active (equal to 'one') is selected by the logic combination of lines 41 and 42. Four combinations can be coded on the two lines, and each of the codes selects a single output, again as shown in FIG. 5. For example, when line 41 is 'zero' and line 42 is 'one,' CKEL is 'one' during line 43 equal to 'one.'

The response of shift register 11 to the pulses on (imaginary) lines 39 or 40 of FIG. 3 and the clock pulses is clear from a consideration of an example. Consider a sequence of binary ones on line 40 accompanied by a binary zero on line 41 of FIG. 4. From the foregoing discussion of the clock circuit arrangement it is clear that alternate clock pulses CKEL and CKOL occur. We will assume an initial condition of all zeros in the register. At time $t_1$ in FIG. 5, gate 36 is high, gate 35 is low, and gate 34 is high. At $t_2$, pulse CKEL goes high, gate 36 goes low forcing gate 35 high, followed by gate 34 going low. Hence a 'one' has been shifted left one stage. At $t_3$, pulse CKOL goes high. Gate 29 in FIG. 2 goes low, since its inputs are both high, gate 28 is forced high, and gate 27 will go low. Thus 'one' have now been and gate 27 will go low. Thus 'ones' have now been shifted two stages to the left.

Subsequent clock pulses CKEL and CKOL move a binary one (input) to the left as viewed while other binary ones are inserted from the right. So long as binary ones are applied to line 40 of FIG. 3, a left shift is required and the clock pulses continue as described. The register fills with binary ones from the right. When a right shift is required, the clock pulses CKER and CKOR are applied and binary zeros are inserted from the left.

The simple implementation of FIGS. 2 and 3 is possible because of the manner in which the bidirectional shift register is used. Since only the contents of a single stage in the register is changed at a given clock time, the odd stages and the even stages indicated as odd and even cells in FIG. 2 can be clocked independently. Each stage of the register is in essence a simple gated latch implemented by only four gates per stage rather than at least nine per stage of the prior art. For an illustrative eight stage register this leads to a savings of 320 elements (at eight elements per gate) per shift register. When we consider that the control circuit utilizes 13 gates or 104 elements in excess of the number of elements used in the prior art components, an overall savings of 216 elements is achieved. This savings simplifies the processing of the shift register in a single integrated circuit chip 80 of FIGS. 2 and 3.

Figure 6:
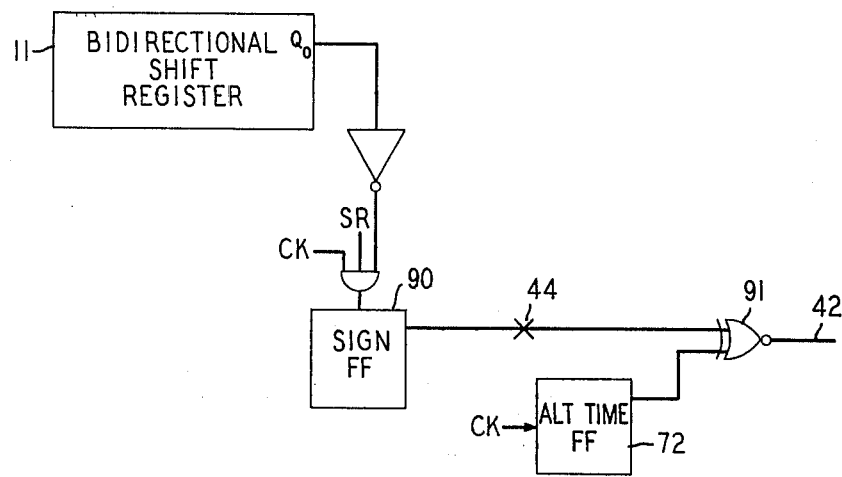
FIG. 6 is a circuit diagram of the control for the circuit of FIG. 4.

As taught in the above-mentioned patent and shown in FIG. 6, a sign flip-flop 90 is toggled and changes stage when the shift register is full of zeros and a right shift is called for on the next pulse. This corresponds to a zero crossing of the quantized (summation) signal output of register 11. The output of flip-flop 90 controls an 'exclusive OR' gate 91, the other input of which is connected to the output of the "alternate time" flip-flop 72 of FIG. 4. In the clock generating circuitry of FIG. 4, then, the relationship between the alternate time signal and the clock outputs is reversed when the polarity of the quantized (summation) signal reverses. That is to say, the "alternate time" waveform of FIG. 5 is complemented (with respect to the clock pulses) in the figure and causes pulses CKEL and CKOL to occur at timers $t_2$ and $t_1$, respectively, in FIG. 5, as well as similarly reversing pulses CKER and CKOR.

What has been described is considered merely illustrative of the principles of this invention. Therefore, various modifications thereof can be devised by those skilled in the art in accordance with those principles within the spirit and scope of the invention as claimed.

For example, techniques for providing polarity control to accommodate both positive and negative signals are obtained as taught in the above-mentioned patent.

What is claimed is:

1. An analog-to-digital encoding system including means responsive to an analog input signal for generating first pulses indicative of the instantaneous value of that signal, said means comprising a shift register, a clock circuit and a digital signal generator including a digital-to-analog converter and a comparator, said comparator having first and second inputs, said shift register including pluralities of even and odd stages and first and second terminal stages, said first and second terminal stages having first and second information inputs respectively, said even and odd stages and said first and second terminal stages having first and second clock inputs for shifting information therein in first and second directions respectively, and means for inputting information to said first and second information inputs selectively, said shift register being operative to apply to said digital-to-analog converter a quantized signal representative of the information in the stages therein, said converter being responsive to said quantized signal to apply a quantized analog signal to said first inputs of said comparator, means for applying analog signals to said first and second inputs, said comparator being responsive to said analog input signal and said quantized analog signal to generate a direction-control signal, said clock circuit being adapted only for moving a transition between a sequence of binary ones and a sequence of binary zeros to apply clock pulses alternately to said clock inputs of said even and odd stages or said odd and said even stages respectively under the control of said direction-control signal.

2. An analog-to-digital encoding system including means responsive to an analog signal for generating first pulses indicative of the instantaneous value of that signal, said system comprising means responsive to each of said pulses and a clock pulse including a multistage bidirectional shift register comprising odd and even stages for generating a quantized digital signal representative of the outputs of said stages, means responsive to said digital signal for forming a quantized analog signal and means for comparing said first pulses and said quantized analog signal for generating a direction-control signal, said system also including logic circuit means responsive to said direction-control signal for generating a sequence of first and second or third and fourth clock pulses for switching said odd and even stages or said even and odd stages in a manner to only move a transition between a sequence of binary ones and a sequence of binary zeros therein in a first or a second direction in said register, said register being organized so that said odd and said even stages can be switched independently.

3. A system in accordance with claim 2 wherein said register comprises a semiconductor integrated circuit in which each stage comprises four gates.

4. A bidirectional shift register adapted for use in analog-to-digital encoding system in accordance with claim 2, said register comprising a plurality of odd and even stages each having first and second clock inputs and being adapted for movement of information in first and second directions therein responsive to pulses applied to said first and second inputs respectively.

5. A bidirectional shift register in accordance with claim 4 comprising an integrated semiconductor chip including four gates per stage.

6. A bidirectional shift register in accordance with claim 4 in combination with means responsive to first and second direction-control signals for applying clock pulses alternately to said first inputs to said even and said odd stages and for applying clock pulses alternately to said input of said odd and even stages respectively for controlling the movement of information in first and second directions.

* * * * *